US006890795B1

(12) United States Patent
Wong et al.

(10) Patent No.: US 6,890,795 B1
(45) Date of Patent: May 10, 2005

(54) WAFER LEVEL SUPER STRETCH SOLDER (75) Inventors: Ee Hua Wong, Singapore (SG); Ranjan Rajoo, Singapore (SG); Poi Siong Teo, Singapore (SG)

(73) Assignees: Agency for Science, Technology and Research, Singapore (SG); National University of Singapore, Singapore (SG); Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 10/748,736

(22) Filed: Dec. 30, 2003

(51) Int. Cl.[7] .............................................. H01L 21/44
(52) U.S. Cl. ........................ 438/114; 438/117; 438/613
(58) Field of Search ................................ 438/108, 114, 438/117, 465, 612, 613, 614

(56) References Cited

U.S. PATENT DOCUMENTS

| | | | | |
|---|---|---|---|---|
| 5,251,806 | A | | 10/1993 | Agarwala et al. ...... 228/180.22 |
| 5,441,195 | A | | 8/1995 | Tustaniwskyj et al. 228/180.22 |
| 5,790,377 | A | | 8/1998 | Schreiber et al. ........... 361/704 |
| 5,964,396 | A | | 10/1999 | Brofman et al. ....... 228/180.22 |
| 5,975,409 | A | | 11/1999 | Brofman et al. ....... 228/180.22 |
| 6,180,504 | B1 | * | 1/2001 | Farnworth et al. .......... 438/612 |
| 6,335,222 | B1 | * | 1/2002 | DiStefano ................... 438/108 |
| 6,442,831 | B1 | | 9/2002 | Khandros et al. ............. 29/843 |
| 6,458,622 | B1 | * | 10/2002 | Keser et al. ................ 438/117 |
| 6,780,746 | B2 | * | 8/2004 | Kinsman et al. ............ 438/113 |

OTHER PUBLICATIONS

Larry Gilg, Die Products Consortium, Austin, TX–EP&P, Jul. 1, 2002, "Wafer–Level vs. Singulated Die Burn–In and Test".

Beth Keser, et al., "Encapsulated Double–Bump WL–CSP: Design and Reliability", Proc. 51st Electronic Component Tech. Conf. 2001, pp. 35–39.

J. Simon, "Development and Board Level Reliability of a Wafer–Level CSP", Proc. 41st IEMT/IMC 2000, pp. 22–27.

S.I. Denda, et al., "Wafer Level Packaging Technology in Japan", Proc. 4th IEMT/IMC, 2000, pp. 4–9, (Fig. 2).

Advanced IC Packaging Markets and Trends, pp. 4–49 to 4–51, Electronic Trend Publication, 6th Edition, 2002.

Bakir, et al., "Sea of Leads Ultra High–Density Compliant Wafer–Level Packaging Technology", Proc. 52nd Elec. Component Tech. Conf., 2002, pp. 1087–1094.

P. Garrou et al., Cyclotene BCB Resin for Bumping and Wafer Level Chip Scale Packaging (WL–CSP), Proc. 3rd IEMT/IMC, pp. 206–211, 1999.

* cited by examiner

*Primary Examiner*—Chandra Chaudhari
(74) *Attorney, Agent, or Firm*—George O. Saile; Stephen B. Ackerman (57) ABSTRACT

We disclose a technique to generate stretched solder columns (bumps) at the wafer level, suitable for wafer level packaging. This is accomplished through use of using two wafers—the standard (functional) wafer that contains the integrated circuits and a master (dummy) wafer on whose surface is provided an array of solder bumps that is the mirror image of that on the functional wafer. After suitable alignment, both sets of solder bumps are melted and then slowly brought together till they merge. Then, as they cool, they are slowly pulled apart thereby stretching the merged solder columns. Once the latter have fully solidified, they are separated from the master wafer only.

31 Claims, 6 Drawing Sheets

WAFER LEVEL SUPER STRETCH SOLDER

FIELD OF THE INVENTION

The invention relates to the general field of semiconductor packaging with particular reference to increasing the lengths of solder bumps.

BACKGROUND OF THE INVENTION

This invention discloses a technique to generate stretched solder columns (bumps) at the wafer level, suitable for wafer level packaging and having the following desirable characteristics: Low cost, excellent test and burn-in ability, and high thermal cycling reliability. More specifically, the invention describes (1) a technique of forming stretched solder columns on a functional wafer using a mechanical process (2) techniques to separate these stretched solder columns from a dummy wafer, leaving the stretched solder attached to only the functional wafer, and (3) the technique of forming the super stretched solder through controlled solidification.

Integrated Circuit (IC) devices, be they microprocessor or memory devices, will, in general, need to be connected to a printed circuit board (PCB). Besides providing electrical interconnection, microelectronic packaging also provides mechanical support and protection to the delicate IC and the interconnections, as well as providing thermal paths for heat dissipation. Microelectronic packaging, especially those used in commercial products, is also driven by lower cost and reduced size. Chip Scale Package (CSP) with small silicon-to-package area ratio is widely used in commercial portable products where size is of paramount importance.

Recently, there has been very high interest in Wafer Level Packaging (WLP). WLP, as the name implies, involves packaging at the wafer level and then mounting individual packages onto printed circuit boards (PCBs) using solder interconnections. WLP offers the lowest silicon-to-package area ratio possible. However, the main driver for WLP is the reduced cost associated with the integration of test and burn-in procedures at the wafer level, eliminating costly burn-in and test (BT) at the package level.

The main obstacle to implementing a WLBT process has been the problem of developing a full-wafer contact technology that has the process capability required for manufacturing [1]. In other words, the hundreds of test pins from the tester must be able to make contact with the corresponding solder bumps on the wafer. This requires a new approach to the design of test pins as well as very high co-planarity of the solder bumps.

Figure 1A:
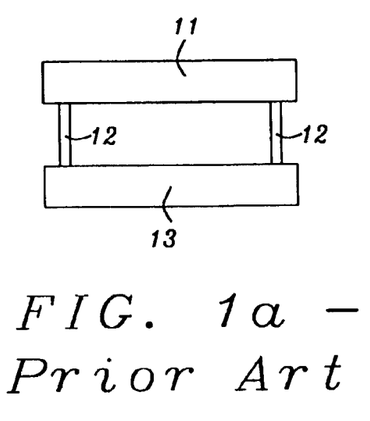
FIGS. 1a and 1b illustrate the problem of solder bump stressing during thermal cycling.
Figure 1B:
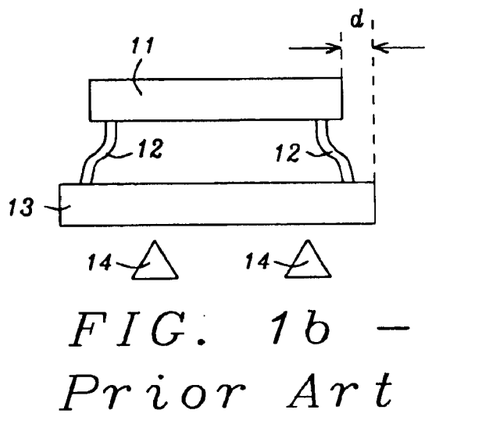

Besides cost and testability, a good WLP design must also address an important issue in microelectronic assembly, namely thermal cycling reliability. A microelectronic assembly will experience millions of cycles of temperature excursion during field application due to power on-off. During each such temperature cycle, the silicon chip and the organic substrate/board expand and contract by different amounts due to different coefficients of thermal expansion. This thermal mismatch applies a high stress/strain to the solder that is interconnecting the silicon chip and the organic substrate/board, as illustrated in FIGS. 1a and 1b. FIG. 1a shows a schematic view of a chip 11 that has been attached to PCB 13 through solder bumps 12 while FIG. 1b shows 1a after it has been heated through arrows 14), as a result of which PCB 13 has expanded, relative to chip 11, by an amount d resulting in stress/strain on solder bumps 12. With the industry trend towards the use of larger dies (over 400 mm$^2$) and miniaturized interconnections, the thermal cycling reliability of the interconnections has become more critical.

It is intuitive from FIG. 1b that the stress/strain on the interconnection can be reduced by increasing the length of standoff 12 and/or increasing the rotational freedom of the interconnection ends that are attached to the chip or the substrate.

A number of wafer level packaging schemes have been pursued by the industry to enhance the thermal cycling reliability of the solder interconnections. These include:

(1) Stacked Solder technique [2–4] where the standoff between the chip and the substrate is increased by multiple stacking of solder bumps/balls. However, this technique suffers from low process efficiency due to the sequential stacking processes.

(2) Copper Post technique [5–7] where the standoff between the chip and the substrate is increased through use of a copper column that is electroplated upwards from the under bump metalization (UBM) of the wafer. The main drawback of this process is the long electroplating duration as well as the expensive (material and capital) lithography process required to electroplate the copper column.

(3) Stress Buffer technique [8–10] where the UBM is formed on compliant polymeric layers that increase the rotational freedom of the solder interconnection. Besides the expensive lithography process, the improvement in thermal cycling reliability from enhanced rotational free is limited compared to that from an increasing standoff. All the above techniques also suffer from poor test and burn-in ability due to poor wafer level co-planarity of the solder bumps.

REFERENCES

[1] Larry Gilg, Die Products Consortium, Austin, Tex.—EP&P, Jul. 1, 2002

[2] U.S. Pat. No. 5,251,806, "Method of forming dual height solder interconnections", IBM, October 1993.

[3] Beth Keser, et al. "Encapsulated double-bump WL-CSP: Design & reliability", Proc. 51$^{st}$ Electronic Component Technology Conference, pp 35–39, 2001.

[4] J. Simon, "Development and board level reliability of a wafer level CSP", Proc. 41$^{st}$ IEMT/IMC, pp. 22–27, 2000.

[5] S. I. Denda, et al., "Wafer level packaging technology in Japan", Proc. 4$^{th}$ IEMT/IMC, pp. 4–9, (FIG. 2), 2000.

[6] Advanced IC packaging markets and trends, pp 4–49 to 4–51, Electronic Trend Publication, 6$^{th}$ Edition, 2002.

[7] U.S. Pat. No. 5,790,377, "Integral copper column with solder flip chip", Packard Hughes Interconnect, August 1998.

[8] Bakir, et al., "Sea of leads ultra high-density compliant wafer-level packaging technology", Proc. 52$^{nd}$ Electronic Component Technology Conference, pp. 1087–1094, 2002.

[9] P. Garrou, et al., "Cyclotene BCB resin for bumping and wafer level chip scale packaging (WLCSP), Proc. 3$^{rd}$ IEMT/IMC, pp. 206–211, 1999.

[10] S. I. Denda, et al., "Wafer level packaging technology in Japan", Proc. 4$^{th}$ IEMT/IMC, pp. 4–9, (FIG. 10), 2000.

A routine search of the prior art was performed with the following additional references of interest being found:

U.S. Pat. No. 5,441,195 Tustaniwskyj et al. August 1995—method of stretching solder joints. U.S. Pat. No. 5,964,396 Brofman et al. October 1999—enhanced ceramic ball grid array using in-situ solder stretch with clip. U.S. Pat. No. 5,975,409 Brofman et al. November 1999—ceramic ball grid array using in-situ solder stretch. U.S. Pat. No. 6,442, 831 Khandros et al. September 2002—method for shaping spring elements.

SUMMARY OF THE INVENTION

It has been an object of at least one embodiment of the present invention to provide a method for forming elongated solder bumps.

Another object of at least one embodiment of the present invention has been to apply said method to wafer level packaging.

Still another object of at least one embodiment of the present invention has been that said method be inexpensive and rapid.

A further object of at least one embodiment of the present invention has been that solder bumps produced as the end product of said method have flat co-planar ends.

These objects have been achieved by using two wafers—the standard (functional) wafer that contains the integrated circuits and a master (dummy) wafer on whose surface are provided an array of solder bumps that is the mirror image of that on the functional wafer. After suitable alignment, both sets of solder bumps are melted and then slowly brought together till they merge. Then, at constant temperature, they are slowly pulled apart thereby stretching the merged solder columns to the desired length. We have employed two general approaches to dealing with the problem of how to separate the two wafers:

(1) Weak Metalization:
The distance between the wafers is maintained until the solder columns have fully solidified and acquired their full mechanical strength. The functional wafer is then displaced slightly causing the more weakly bonded end to separate.

(2) Leveling Techniques:
The functional wafer is cooled to at least 50 C below the hot working temperature of the solder while the master wafer is brought to the appropriate hot working temperature. While maintaining the latter temperature, the wafers are gradually separated. The associated temperature gradient causes the stretching of the solder to be greatest at the master wafer end, the solder eventually breaking off there.

After separation from the functional wafer surface, the elongated solder bumps tend to have uneven ends. This is corrected by pressing a flat heated plate against said ends which causes them to flatten out and become coplanar. This flattening process is performed while maintaining the functional wafer at a low temperature and while the leveling press is heated to the hot working temperature of the solder. This ensures that the solder columns do not collapse during the leveling process. Note that the surface of the leveling press is non-wetting with respect to the solder.

As an alternative to the preferential separation of the elongated solder bumps at the functional wafer surface, a sacrificial layer may be deposited onto the master wafer's surface prior to the formation of the mirror image bump array. Separation of the elongated solder bumps is then achieved through preferential etching away of said sacrificial layer.

A third alternative method to achieve separation of the elongated bumps is to sacrifice the functional wafer in its entirety. This can be done either through etching or through grinding and polishing.

BRIEF DESCRIPTION OF THE DRAWINGS

FIG. 6 schematically illustrates wafer level test and burn-in.

DESCRIPTION OF THE PREFERRED EMBODIMENTS

Figure 2A:
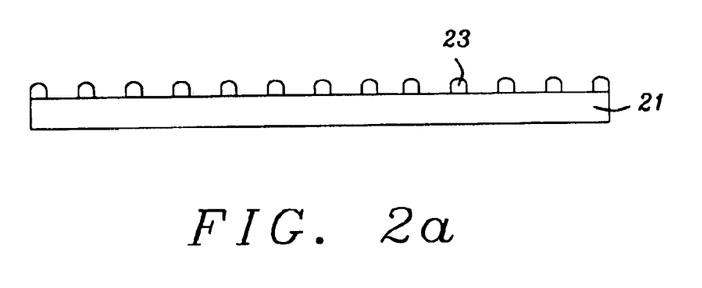
FIGS. 2a and 2b show a key feature of the invention, namely the use of two wafers to achieve elongation of solder bumps.
Figure 2B:
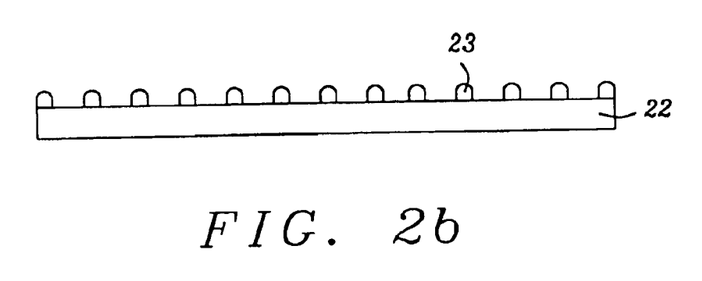

The key novel feature of the invention is that two wafers are used. As shown in FIG. 2, one of them, wafer 21, the functional wafer, is a standard VLSI wafer including connections to its interior that have been made by forming contact pads over openings in the top insulation layer, followed by the attachment of solder bumps, one per pad. Wafer 22 is a master (dummy) wafer that is blank except for the presence on its top surface of an array of solder bumps that is an exact mirror image of that on wafer 21.

For both wafers, the bumps are formed from a high melting solder (melting point above 260 C) using standard processes. Examples of the solder include (but are not limited to) 95Pb5Sn, 90Pb10Sn, and 80Pb2OSn. The adhesion of the metalization to silicon oxide is designed to be weak. An example of weak metallization is gold or copper. The degree of adhesion can be further modified through modification of the surface morphology by means of plasma etching, chemical etching (dry or wet), mechanical roughening; etc.

Figure 3:
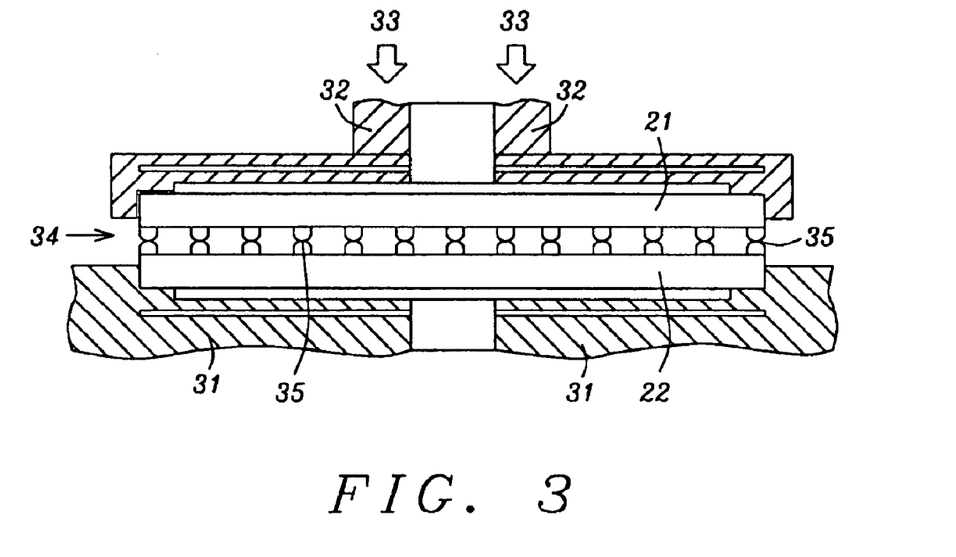
FIG. 3 shows how the solder bumps on the two wafers are merged into a single column.

As shown in FIG. 3, both the functional and the master wafers are gripped by means of vacuum chucks 31 and 32. At least one of the wafer chucks includes a heating element 34 with precision temperature control. One of the wafer chucks is held securely in place while the other is attached to a machine spindle, similar to a standard flip chip attacher, that has full positional and angular adjustment capability. The solder bumps in the top wafer are then positioned above the bottom wafer and aligned relative to the lower wafers solder bumps, at a distance apart, while heat is applied to melt the solder bumps on both wafers. The top wafer is then lowered gradually (arrows 33) until the solder bumps on the wafers merge (shown as merged bumps 35 in the figure).

Figure 4:
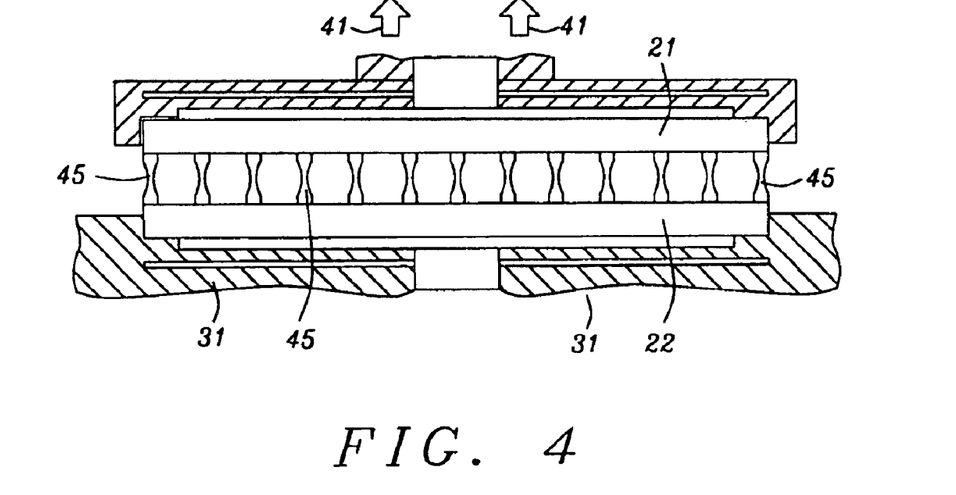
FIG. 4 shows the elongation of the solder bumps.

At constant temperature, the top wafer is raised in a controlled manner (arrows 41), thereby stretching the merged solder bumps so that they become elongated bumps 45, as seen in FIG. 4. The separation between the wafers is stopped when the desired elongated profile of the solder is reached and before any breakage of the elongated bumps can occur.

While maintaining the distance between the two wafers, the temperature of the wafer chuck(s) is reduced to allow cooling of the elongated solder columns 45. Upon solidification, the solder acquires a bulk strength that is significantly higher than the adhesion strength of the weaker metalization on the functional wafer. The chuck that grips the functional wafer (21 in FIG. 5) is then given a minute upward displacement that will result in separation of the weaker metalization and its associated solder columns from the master wafer. The ends of the solder columns are now exposed.

Figure 5:
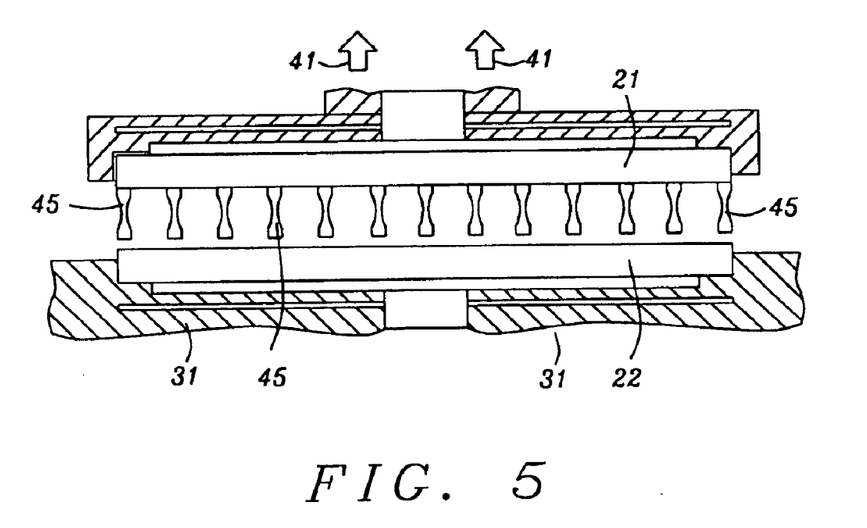
FIG. 5 illustrates how the solder bumps may be separated from one of the two substrates to which they initially adhere.

The weaker adhesion to the surface of the functional wafer is achieved by using metalization that has inherently poor adhesion to the silicon substrate. For example, one might use Cr/Cu/plated Cu/Ni (UBM) on the master wafer. The bulk strength of the solder is around 30 MPa. The net result is that the force required to cause separation of the master pads is less than 50% of what is needed to initiate damage in the stretched solder. Assuming an area ratio 5:1 between the pad and the solder column at its minimum cross-section, the adhesion strength of the metalization to the pad needs to be 0.1 to 3 MPa. This minimum adhesion strength is necessary to ensure that the metalization survives the fabrication processes.

Figure 6:
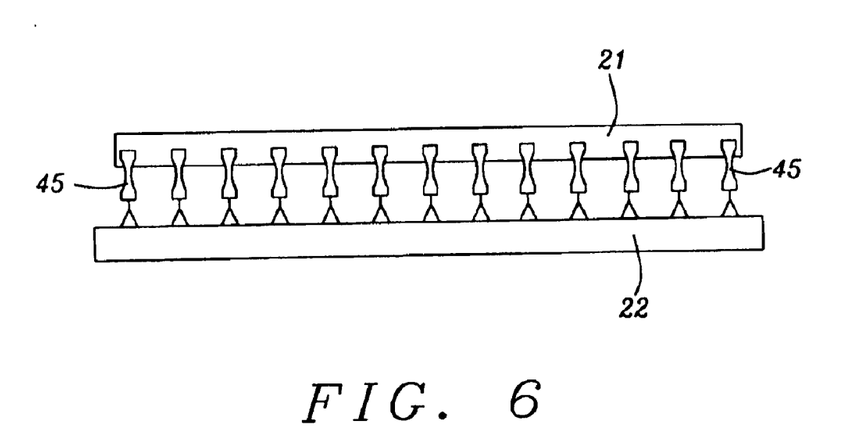

As a consequence of the above-described process, the exposed ends of the solder columns will have acquired the high level of co-planarity necessary for wafer level burn-in and test (shown schematically in FIG. 6).

Figure 7:
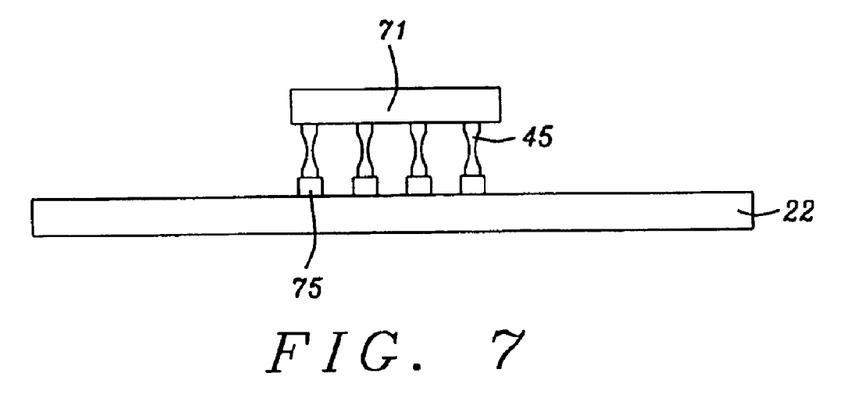
FIG. 7 shows attachment of a chip to a PCB.

As seen in FIG. 7, the functional wafer is now diced into individual chips 71 that are ready to be attached to a PCB which is pre-mated with a finish layer of solder 75 that has a melting point about 80–100° C. below that of the solder columns, for example, 63Sn37Pb eutectic solder. This ensures that the solder columns do not collapse during mounting of the chip to the PCB. The master wafer can now be recycled by chemical cleaning or mechanical polishing, followed by the deposition of fresh, weakly adhering metalization.

This new technique offers several attractive features:

Low cost—Low material cost; short processing time (less than 2 minutes excluding time to recycle the functional wafer).

Maximum bump co-planarity—A critical feature for wafer level test and burn-in.

High thermal cycling reliability—Because of the high standoffs

Elimination of under-fill—Lowers cost and eliminates popcorn cracking

Design flexibility—Degree of solder column elongation readily varied.

We now describe some possible variations of the basic invention that was disclosed above:

1. Alternative solder alloy systems: Instead of the system of high temperature solder column (melting temperature above 280° C.) used with near eutectic SnPb solder joining, an alternative system of Pb-free solder (melting temperature about 220° C.) and a near eutectic SnBi solder joint may be used.

Figure 8:
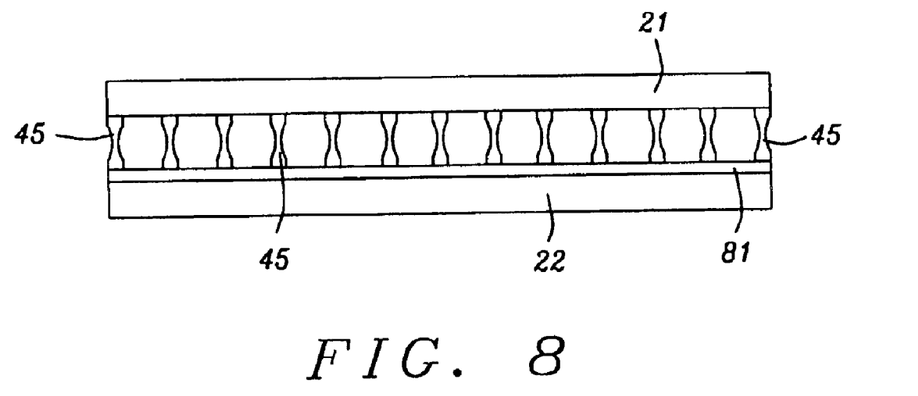
FIG. 8 shows how a sacrificial layer may be used to facilitate separation of the extended bumps from one of the wafers.

2. Alternative techniques for separating and exposing the solder columns:

2.1. As shown in FIG. 8, sacrificial layer 81 (typically between about 0.2 and 0.4 microns thick) is first deposited onto the surface of functional wafer 22. After the elongated solder bumps have been formed, as described above, layer 81 is selectively removed through chemical etching, thereby allowing the separation of the elongated solder columns. The sacrificial layer may be organic, such as a high temperature polymer, or inorganic, such as amorphous silicon, polysilicon, or silicon oxide.

Figure 9:
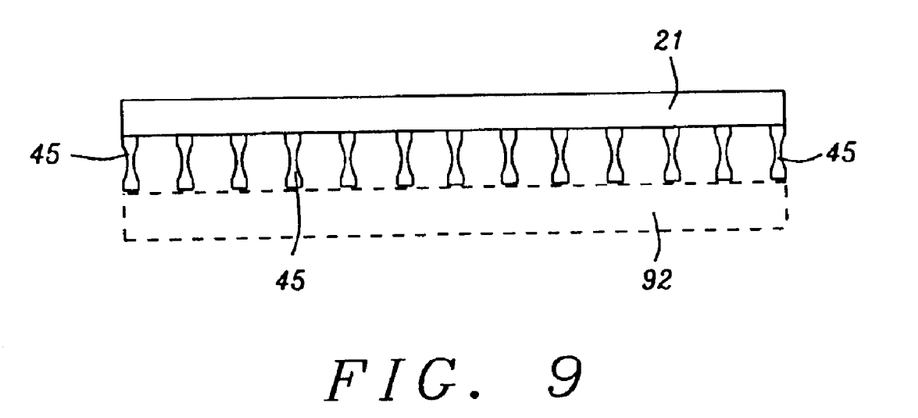
FIGS. 9 and 10 illustrate how solder bump separation may be effected through full consumption of the entire functional wafer.

2.2 As shown schematically in FIG. 9, the entire functional wafer 92 may be removed through chemical etching, thus exposing the solder columns.

Figure 10:
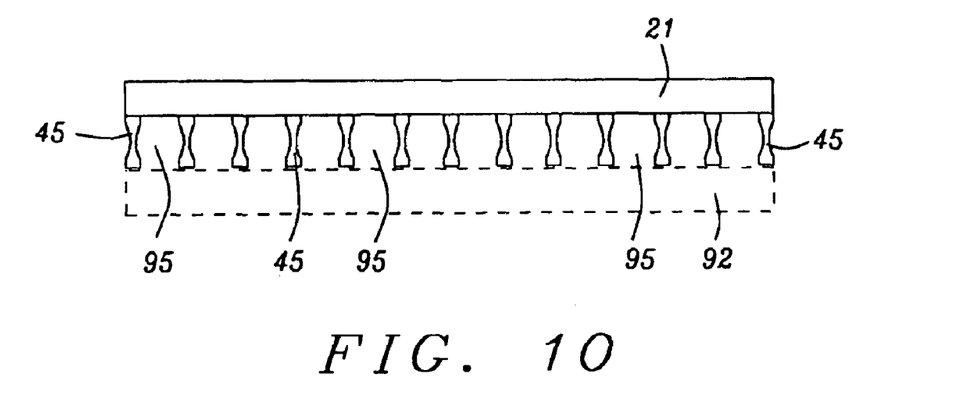

2.3 As shown in FIG. 10, the entire functional wafer 92 may be removed through mechanical grinding and polishing, or through chemical-mechanical polishing (CMP). Upon cooling, and prior to grinding/polishing, the space between the master and the functional wafers is impregnated with a wax-like material 95 such as Nikka Seiko's Skycoat. The wax servers to protect the delicate solder columns from damage during the grinding process. Once the functional wafer has been ground away, the wax may be removed, if desired, with simple heating or chemical etching.

As an alternative to wax, a thermoplastic material may be used. In this case, the reinforcing thermoplastic will be left in the master wafer and will be part of the diced chip. The thermoplastic will soften and make good adhesion with the PCB during solder reflow, thereby serving as a reinforcement for the solder interconnections, similar to an under-fill material.

2.4 Leveling Technique

Figure 11A:
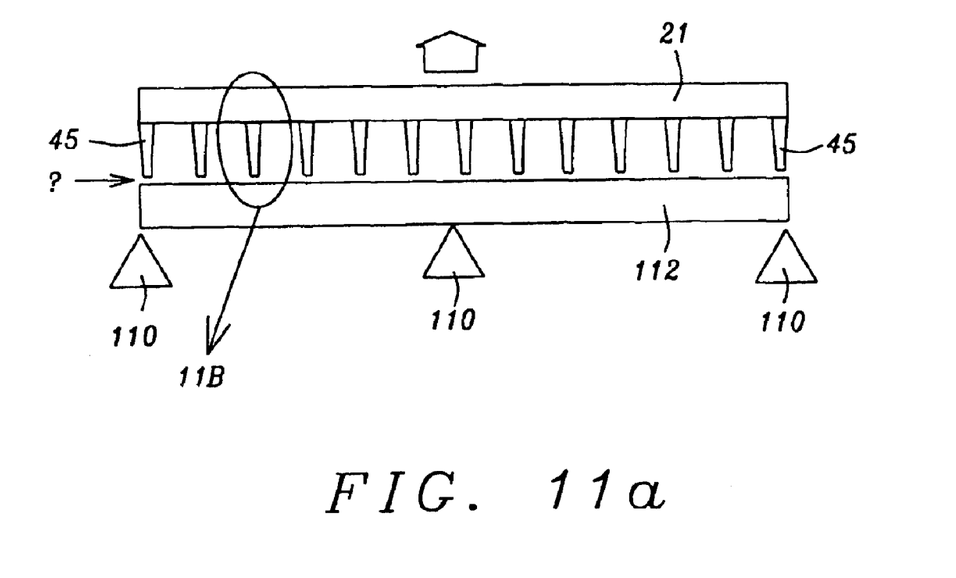
FIGS. 11a, 11b, and 12 show a method for making the solder bumps' ends flat, dovetailed in shape, and co-planar.
Figure 11B:
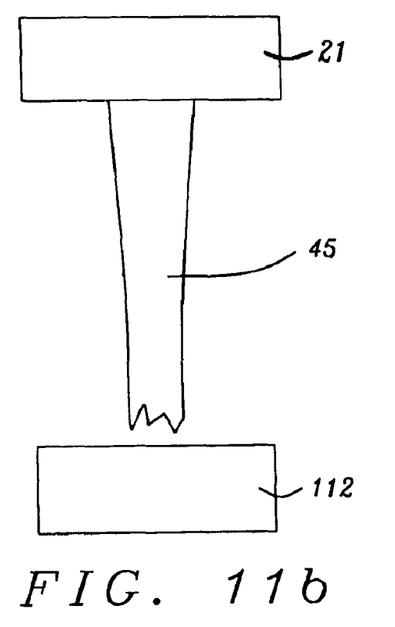
Figure 12:
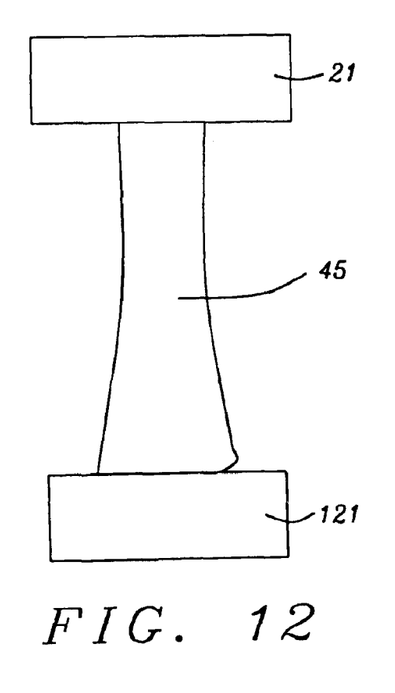

After achieving the desired stretched height, the functional wafer is cooled to at least 50° C. below the hot working temperature of the solder while the master wafer is brought to the appropriate hot working temperature. While maintaining the latter temperature, the wafers are gradually separated. The associated temperature gradient causes the stretching of the solder to be greatest at end near the master wafer 112 and eventually breaks off (FIG. 11a). After separation from the master wafer, the elongated solder bumps tend to have uneven ends (FIG. 11b). This is corrected through a leveling process. In the leveling process, the functional wafer is held with a chuck, which may be the same as that during the stretching, with the free-standing stretched solder (with uneven ends) facing down. The temperature of the wafer is maintained at 50 to 100° C. below the hot working temperature of the solder. This is to prevent collapsing of the solder column during leveling. The wafer is lowered and pressed against a leveling plate (non wetting to solder) which is maintained at the hot work temperature of the solder. The temperature gradients results in local deformation in the solder at the end in contact with the leveling plate. This local deformation results in dovetailing of the solder which serves as a good anchor when attached to the printed circuit board. On the wafer level, the leveling process enforces coplanarity among all the solder columns in the wafer.

2.5 Flexible Laminate Technique

This technique differs from the above techniques in that a flexible laminate is used in place of the master wafer to provide for the stretching.

Stage 1: Pattern flexible laminate. The process starts with a copper foil—dry film flexible laminate that is supplied in a roll form. The laminate is then patterned to expose the copper foil with the desired pattern of solder bumps.

Stage Ia: Formation of solder bumps on a flexible laminate. If so desired, the patterned flexible laminate, may be coated with a solder pattern by using either printing, plating, or jetting. Dry film serves as mask during any of these processes.

Stage 2: Mounting and solder merging: The functional wafer as well as the flexible laminate with patterned pad (or solder bumps) are held by a set of vacuum chucks, equipped with heating, using vacuum. The chuck for the function wafer is attached to a machine spindle that has x-y-z-ϕ degrees of freedom, similar to a standard flip chip attach machine. Using the x-y-ϕ degrees of freedom, the functional wafer is aligned and positioned at a distance over the flexible tape while heat is applied to melt the solder bumps on the functional wafer as well as on the flexible tape (if there is one). Using the vertical degree of freedom, the functional wafer is lowered gradually until the solder bumps are merged.

Stage 3: Stretching. While maintaining the temperature to keep the merged solder in the molten state, the top wafer is raised in a controlled manner, stretching the solder in the process. The displacement of the top wafer is stopped when the desired elongated profile of the solder is reached.

Stage 4: Cooling. While maintaining the distance between the two wafers, the temperature of the wafer chuck is reduced to allow cooling and solidification of the stretched solder columns. The assembly is then released from the holders.

Stage 5: Exposure of solder columns. The solder columns on the assembly are released from the flexible laminate by chemically etching away the copper foil on the flexible laminate.

Discussion:

The theoretical stretchability of the solder column is a function of pad dimension, the volume, surface energy as well as the density of the solder. The theoretical limit of stretching two 100 micron diameter eutectic solder bumps has been evaluated using Evolver (a computer program that uses the principle of minimum gravitational and surface energy) at 290 microns, or a length to diameter aspect ratio of 2.9 assuming the solders were completely in the molten state. By controlling the temperatures of the two substrates to achieve progressive solidification of the solder column, a practical aspect ratio, of 4.5 has been achieved. This is possible because, during stretching, solidification of the solder column is initiated and advances progressively from one end so that at any given time the aspect ratio in the liquid portion of the solder column is less than the theoretical limit of 2.9.

Advantages Over Prior Art

A comparison of this wafer level packaging process with other established processes is tabulated in the table below:

| Critical Factors | Wafer Level Packaging Processes | | | |
|---|---|---|---|---|
| | WLS[3] | Stacked Solder | Cu Post | Stress buffer layer |
| Processibility (Cost) | 2 (fast action) | 4 (sequential solder stacking) | 3 (long plating duration) | 1 (Additional layer) |
| Reliability | 1 (compliant, no stress concentration sites) | 3 (multiple stress concentration sites) | 2 (weakness along Cu solder interface) | 4 (Least compliant) |
| Testability | 1 (max co-planarity) | 3 (non-coplanar) | 3 (non-planar) | 3 (non-coplanar) |
| Electrical performance | 3 (smooth cross section variation) | 4 (large cross sectional variation) | 2 (better electrical property of Cu) | 1 (shortest height) |
| Overall | 4 (+3) | 10 (+4) | 8 (+2) | 8 (+1) |

The WLS[3] technique presents the most balanced qualities.

More significantly, the WLS technique presents superior reliability, thereby overcoming what has been the main weakness of conventional WLP processes, namely limiting its die size.

What is claimed is:

1. A method to form an elongated solder bump, comprising:

providing a first substrate and forming thereon a first solder bump;

providing a second substrate and forming thereon a second solder bump;

positioning said first and second solder bumps to be in positional and angular alignment relative to one another, said solder bumps being separated by a first distance and said substrates being separated by a second distance;

heating both solder bumps till they melt;

then reducing said first distance until the molten solder bumps merge into a single solder bump;

while maintaining single solder bump in its molten state, increasing said second distance between substrates thereby lengthening said single solder bump and forming said elongated solder bump;

terminating the step of increasing said second distance when said elongated solder bump achieves a desired aspect ratio then allowing it to solidify through cooling; and separating the elongated solder bump from said second substrate only.

2. The method recited in claim 1 wherein said desired aspect ratio is at least 2.

3. A method to form an elongated solder bump, comprising:

providing a first substrate and forming thereon a solder bump;

providing a second substrate and forming thereon a wettable solder pad;

positioning said solder bump and solder pad to be in positional and angular alignment relative to one another, said solder bump and solder pad being separated by a first distance and said substrates being separated by a second distance;

heating said solder bump till it melts;

then reducing said first distance until the molten solder bump contacts and wets the solder pad;

while maintaining said solder bump in its molten state, increasing said second distance between substrates thereby lengthening said solder bump and forming an elongated solder bump;

to terminating the step of increasing said second distance when said elongated solder bump achieves a desired aspect ratio and then allowing it to solidify through cooling; and separating the elongated solder bump from said second substrate only.

4. The method recited in claim 3 wherein said first distance that initially separates the solder bumps is about 0.5 mm.

5. A process to manufacture a wafer level circuit package, comprising:

providing a plurality of integrated circuits on a functional wafer, including a top layer of insulation having access holes for making electrical contact to said integrated circuits;

forming a first pattern of contact pads whereby there is one contact pad over each of said access holes;

providing a master wafer and depositing thereon a sacrificial layer;

forming, on said sacrificial layer, a second pattern of contact pads that is a mirror image of said first pattern;

forming a solder bump on each one of the contact pads;

positioning said master and functional wafers so that each solder bump on the master wafer is in vertical alignment with a solder bump on the functional wafer, said solder bumps being separated by a first distance and said wafers being separated by a second distance;

heating all solder bumps till they melt;

then reducing said first distance until the aligned molten solder bumps touch one another and form merged solder bumps;

while maintaining all solder in its molten state, increasing said second distance between substrates thereby lengthening said merged solder bumps, forming therefrom elongated solder bumps;

terminating the step of increasing said second distance when said elongated solder bumps achieve a desired aspect ratio and then allowing them to solidify through cooling; and selectively removing said sacrificial layer from said master wafer, thereby separating all elongated solder bumps from only said master wafer.

6. The process described in claim 5 wherein said sacrificial layer is selected from the group consisting of high temperature polymers, amorphous silicon, polysilicon, and silicon oxide.

7. The process described in claim 5 wherein said sacrificial layer is deposited to a thickness between about 0.2 and 1 microns.

8. The process described in claim 5 wherein the step of selectively removing said sacrificial layer further comprises etching in Xenon difluoride for between about 2 and 60 minutes at a temperature between about 25 and 34 C.

9. The process described in claim 5 further comprising, after said elongated solder bumps no longer contact said master wafer, dicing said functional wafer into individual chips.

10. The process described in claim 9 wherein said chips are attached to a printed circuit board using a solder whose melting point is at least 50° C. below that of said elongated solder bumps.

11. A process to manufacture a wafer level circuit package, comprising:

providing a plurality of integrated circuits on a functional wafer, including a top layer of insulation having access holes for making electrical contact to said integrated circuits;

forming a first pattern of contact pads whereby there is one contact pad over each of said access holes;

providing a master wafer on whose surface is a second pattern of contact pads that is a mirror image of said first pattern;

forming a solder bump on each one of the contact pads;

positioning said master and functional wafers so that each solder bump on the master wafer is in vertical alignment with a solder bump on the functional wafer, said solder bumps being separated by a first distance and said wafers being separated by a second distance;

heating all solder bumps till they melt;

then reducing said first distance until the aligned molten solder bumps touch one another and merge into single solder bumps;

while maintaining all solder bumps in their molten state, increasing said second distance between substrates thereby lengthening each merged solder bump, forming therefrom elongated solder bumps;

terminating the step of increasing said second distance when said elongated solder bumps achieve a desired aspect ratio and then allowing them to solidify through cooling; and then consuming said master wafer in its entirety whereby said elongated solder bumps are just exposed and remain attached to said functional wafer only.

12. The process described in claim 11 wherein the step of consuming said master wafer further comprises etching it.

13. The process described in claim 11 wherein the step of consuming said master wafer further comprises:

introducing a mechanical stabilization medium between all elongated solder bumps;

grinding and polishing said master wafer until said elongated solder bumps are just exposed; and then removing said mechanical stabilization medium.

14. The process described in claim 13 wherein said mechanical stabilization medium is a wax, or is a thermoplastic which may be left on the wafer and serve as a reinforcement to the interconnect when attached to the board.

15. The process described in claim 11 further comprising, after said elongated solder bumps no longer contact said master wafer, dicing said functional wafer into individual chips.

16. The process described in claim 11 wherein said chips are attached to a printed circuit board using a solder whose melting point is at least 50 C below that of said elongated solder bumps.

17. The process described in claim 11 wherein said desired aspect ratio is at least 2.

18. A process to manufacture a wafer level circuit package, comprising:

providing a plurality of integrated circuits on a functional wafer, including a top layer of insulation having access holes for making electrical contact to said integrated circuits;

forming a first pattern of contact pads whereby there is one first contact pad over each of said access holes, each of said first contact pads having a first adhesive strength with respect to said top layer of insulation;

providing a master wafer on whose surface is a second pattern of contact pads that is a mirror image of said first pattern, said second contact pads having a second adhesive strength, with respect to said master wafer surface, that is less than said first adhesive strength;

forming a solder bump on each one of the contact pads;

positioning said master and functional wafers so that each solder bump on the master wafer is in vertical alignment with a solder bump on the functional wafer, said solder bumps being separated by a first distance and said wafers being separated by a second distance;

heating all solder bumps till they melt;

then reducing said first distance until the aligned molten solder bumps touch one another and merge into single solder bumps;

while maintaining all solder bumps in their molten state, increasing said second distance between substrates thereby lengthening said merged solder bumps, forming therefrom elongated solder bumps;

terminating the step of increasing said second distance when a desired aspect ratio of said elongated solder bumps has been achieved and then allowing them to solidify through cooling; and then separating the master and functional wafers until a separation force that equals said second adhesive strength is achieved whereby all of said elongated solder bumps separate from only said master wafer.

19. The process described in claim 18 wherein said second contact pads are selected from the group consisting of gold, copper, nickel, palladium, tin and silver.

20. The process described in claim 18 wherein said second adhesive strength is less than 50% of a force that initiates damage to said solidified elongated solder bumps.

21. The process described in claim 18 further comprising:
dicing said functional wafer into individual chips and then attaching said chips to a printed circuit board using a solder whose melting point is at least 50° C. below that of said elongated solder bumps.

22. A process to form an elongated solder bump, comprising:
providing flexible laminate of dry film on copper foil;
patterning said dry film thereby exposing said copper foil wherever it is desired to form solder bumps;
coating said copper foil and dry film with solder, said dry film thereby serving as a mask;
aligning and positioning a functional wafer at a distance over said flexible laminate while heat is applied to melt solder bumps on the functional wafer as well as on the flexible laminate;
lowering the functional wafer until all opposing solder bumps are merged;
while maintaining the merged solder in the molten state, raising the functional wafer and thereby stretching the solder;
stopping said raising of the functional wafer when a desired elongated profile of the solder is reached;
while maintaining a separation between the two wafers, cooling the wafer chuck to allow solidification of the stretched solder columns and then releasing all parts from their holders; and
releasing the solder columns from the flexible laminate by chemically etching away the copper foil portion of the flexible laminate.

23. The process described in claim 22 wherein said solder is deposited by printing, plating, jetting or solder ball placement.

24. The process described in claim 22 wherein said flexible laminate is in the form of a roll.

25. A process to manufacture a wafer level circuit package, comprising:
providing a plurality of integrated circuits on a functional wafer, including a top layer of insulation having access holes for making electrical contact to said integrated circuits;
forming a first pattern of contact pads whereby there is one contact pad over each of said access holes;
providing a master wafer on whose surface is a second pattern of contact pads that is a mirror image of said first pattern;
forming a solder bump on each one of the contact pads on said functional wafer;
positioning said master and functional wafers so that each solder bump on the functional wafer is in vertical alignment with a solder pad on the master wafer, said solder bumps and pads being separated by a first distance and said wafers being separated by a second distance;
heating all solder bumps till they melt;
then reducing said first distance until the aligned molten solder bumps touch and wet the solder pads;
while maintaining all solder bumps in their molten state, increasing said second distance between substrates thereby lengthening each of said solder bumps, forming elongated solder bumps;
terminating the step of increasing said second distance when said elongated solder bumps achieve a desired aspect ratio and then lowering the temperature of the master wafer to a hot working temperature of the solder while maintaining the functional wafer at a lower temperature;
while maintaining a temperature gradient in the solder, further separating the master and functional wafers until physical separation of the elongated solder from only said master wafer occurs; and
leveling uneven ends of separated and elongated solder by means of a non-wetting leveling plate.

26. The process described in claim 25 wherein, after the elongated solder bumps have achieved a desired aspect ratio, the functional wafer is cooled to at least 50° C. below the hot working temperature of the solder while the master wafer is brought to the hot working temperature of the solder.

27. The process described in claim 25 wherein the leveling process further comprises:
holding the functional wafer, with free-standing unevenly elongated solder bumps, on the same chuck used for elongation;
maintaining the wafer at a temperature that is at least 50 C below the hot working temperature of the elongated solder; and
lowering the functional wafer so that the elongated solder bumps are pressed against a heated leveling plate, thereby causing them to flatten out and their ends to become co-planar.

28. The process described in claim 25 wherein the leveling plate is heated to the hot working temperature of the solder and its surface is aligned parallel to that of the functional wafer.

29. The process described in claim 25 wherein flattening is such that all the elongated solder bumps have the same height with flat and dovetail-shaped ends.

30. The process described in claim 25 further comprising dicing said functional wafer into individual chips and then attaching said chips to a printed circuit board using a solder whose melting point is at least 50° C. below that of said elongated solder bumps.

31. The process described in claim 29 wherein the solder that has a lower melting temperature melts and wets the dovetail-shaped solder columns thereby anchoring the elongated solder bumps to the printed circuit board during attachment.

* * * * *